United States Patent [19]

Stein et al.

[11] 4,021,787

[45] May 3, 1977

[54] INFORMATION STORAGE CIRCUIT EMPLOYING MNOS TRANSISTORS

[75] Inventors: Karl-Ulrich Stein, Munich; Karlheinrich Horninger, Gauting, both of Germany

[73] Assignee: Siemens Aktiengesellschaft, Berlin & Munich, Germany

[22] Filed: May 13, 1975

[21] Appl. No.: 576,989

Related U.S. Application Data

[62] Division of Ser. No. 398,397, Sept. 18, 1973, abandoned.

[30] Foreign Application Priority Data

Sept. 18, 1972 Germany .......................... 2245688

[52] U.S. Cl. ............................................ 340/173 R
[51] Int. Cl.² .................. H01I 11/14; G11C 11/40
[58] Field of Search ................ 340/173 R, 173 VT

[56] References Cited

UNITED STATES PATENTS 3,618,051 11/1971 Oleksiak .................. 340/173 R
3,653,002 3/1972 Goffee ..................... 340/173 R

*Primary Examiner*—Vincent P. Canney
*Attorney, Agent, or Firm*—Hill, Gross, Simpson, Van Santen, Steadman, Chiara & Simpson

[57] ABSTRACT

An MNOS transistor for electric information storage circuits includes one channel and has a layered gate insulator. A plurality of such MNOS transistors are arranged in a matrix on the substrate and the start voltage is variably dependent upon the electric charge stored in the gate insulator of each transistor. The channel length of the MNOS transistor is shorter than twice the depletion layer thickness during recording or erasure of data, and during recording of data and during read-out and erasure of data only voltages of the same polarity are applied between the gate, source, and drain electrodes and the common substrate.

6 Claims, 4 Drawing Figures

INFORMATION STORAGE CIRCUIT EMPLOYING MNOS TRANSISTORS

This is a division of application Ser. No. 398,397, filed Sept. 18, 1973, now abandoned.

BACKGROUND OF THE INVENTION

1. Field of the Invention

This invention relates to an MNOS transistor for electric circuits, the transistor having a single channel and a layered gate insulator, and more particularly to such an MNOS transistor which is arranged on a substrate and in which the threshold voltage is variably dependent upon the electric charge stored in the insulator.

2. Description of the Prior Art

A storage arrangement of the type mentioned above is described in the publication Component Technology, vol. 4, No. 5, October 1970, PP. 17–21, in which the matrix of the storage arrangement consists of MNOS transistors.

The aforementioned type of storage arrangement, however, is subject to disadvantages. For example, for the switching of MNOS transistors during the recording of data and cduring the readout and erasure of data, voltages are required which have different polarities in relation to the semiconductor substrate. Therefore, in storage arrangements in the single channel technique it is necessary to construct the storage matrix and the associated decoders on separate substrates. Single channel semiconductor technique is understood to be a technique in which either only p-channel MOS field effect transistors or only n-channel MOS field effect transistors are used. Generally, only one diffusion process is required in the semiconductor substrate.

SUMMARY OF THE INVENTION

An object of the present invention is to provide an MNOS transistor for electric circuits in which, dependent upon the electric charge stored in the gate insulator, it is possible to modify the threshold voltage with electric voltages having a single polarity connected to the gate, source and drain electrodes.

The foregoing object is achieved through the provision of an MNOS transistor as described above which features a channel length that is shorter than twice the depletion layer thickness during the recording or the erasure of data, and one in which during the recording data and during the read-out and erasure of data only voltages of the same polarity are applied between the gate, source and drain electrodes, on the one hand, and the common substrate on the other hand.

Preferably, the MNOS transistors are arranged on a common 10 Ohm cm n-conducting silicon substrate. The gate insulator of the transistors consist of a 2 nm thick SiO$_2$ layer and a 55 nm thick Si$_3$N$_4$ layer carried upon the SiO$_2$ layer. The channel length of the transistors advantageously amounts to 1 to 5 $\mu$m and the voltages employed for recording, read-out and erasure of data preferably amount to 0 and −40 Volts.

A particular advantage of a storage arrangement containing MNOS transistors and constructed in accordance with the present invention resides in the fact that it is not necessary, as in the abovementioned prior art, to divide the common substrate into electrically isolated sections by means of diffused-in zones, as is conventional in the complementary channel MOS technique or the bipolar technique.

BRIEF DESCRIPTION OF THE DRAWINGS

Other objects, features and advantages of the invention, its organization, construction and operation will be best understood from the following detailed description of a preferred embodiment thereof taken in conjunction with the accompanying drawing, on which.

DESCRIPTION OF THE PREFERRED EMBODIMENT

Figure 1:
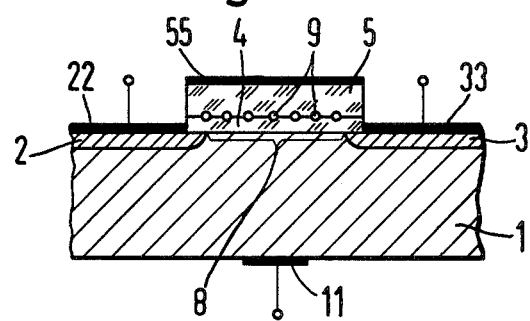
FIG. 1 is a schematic illustration of an MNOS transistor.

Referring to FIG. 1, a p-channel transistor includes a substrate 1 of preferably a 10 Ohm cm n-conducting silicon. The transistor includes a p-conducting source zone 2 and a p-conducting drain zone 3. These zones are preferably diffused into the substrate 1. The transistor further includes a layered gate insulator 4, 5. The layered gate structure preferably consists of a 2 nm thick SiO$_2$ layer 4 and a 55 nm thick Si$_3$N$_4$ layer 5 carried on the SiO$_2$ layer. The source zone 2 carries an electrode 22; the drain zone 3 carries an electrode 33; the substrate carries an electrode 11; and the gate 4, 5 carries an electrode 55.

The transistor includes a channel having a channel length 8 which, in accordance with the invention and particularly advantageous for storage arrangements, is shorter than twice the depletion layer thickness during recording the erasure. In an MNOS transistor as set forth above and illustrated in FIG. 1, the channel length preferably amounts to 1 to 5 $\mu$m. The depletion layer thickness is to be understood to be the thickness of the space charge zone in the substrate around the source and drain zones in dependence upon the voltage applied to the source and drain electrodes.

At the boudary layer between the SiO$_2$ layer 4 and the Si$_3$N$_4$ layer 5 a large number of traps 9 are arranged, which traps are charged or discharged by different voltages of the same polarity at the source, drain and gate. Consequently, the transistor possesses either a high or a low threshold voltage. The threshold voltage is to be understood to be the voltage at which the transistor becomes conductive when such voltage is applied to the gate. These resulting two states can be used to define and effect storage of the data 0 and 1.

Figure 3:
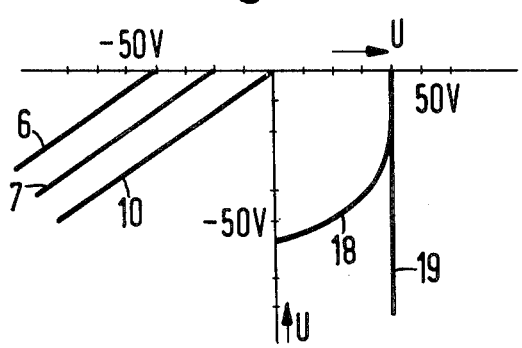
FIG. 3 is a graphic illustration of the storage characteristic of an MNOS transistor according to the present invention having a short channel length.

Referring to FIG. 3, the characteristic storage curves of an MNOS transistor as described above are illustrated for a transistor having channel length of 3 $\mu$m. This graphic illustration includes an operative line 6 effective during the recording of the state 1, a prevention or inhibiting line 7 for preventing the recording of a 1, and a read-out line 10. A line 19 represents the operative line for erasure, i.e. for the recording of the state 0 in an MNOS transistor having a long channel length. The curve 18 represents the operative line for erasure of an MNOS transistor of short channel length as is employed in the circuits constructed in accordance with the present invention. As can be seen from the lines 18 and 19, in MNOS transistors of short channel length, an influence of the drain and source voltage on the gate voltage may be noted.

In order to record a 0 into the MNOS transistors of a storage arrangement in accordance with the present invention, the gate is connected to 0 Volts and the source and drain are connected to −40 Volts. During the recording of a 1, the source and drain are connected to 0 Volts, and the −40 Volts are applied between the substrate electrode 11 and the gate electrode 55. The erasure of data recorded into a transistor is effected by establishing the 0 state. The read-out process corresponds to the recording process. However, the read-out voltage applied to the gate electrode 55 will preferably amount to −10 Volts.

Figure 2:
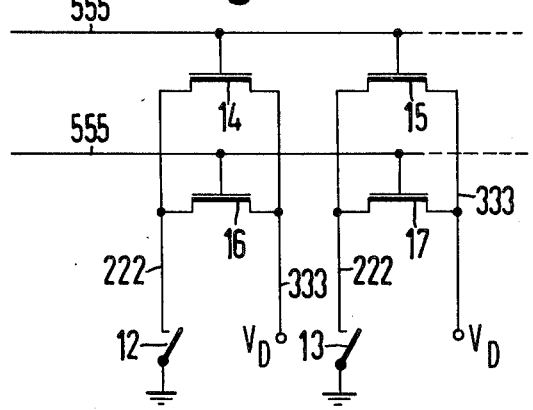
FIG. 2 is a schematic circuit diagram illustrating a storage matrix consisting of MNOS transistors.

The mode of operation of an MNOS storage matrix will now be explained with reference to a storage matrix of 2 × 2 transistors. FIG. 2 represents a matrix of this type and reference should be taken to that figure. The matrix comprises four transistors 14, 15, 16 and 17. Before initiation of the operation, a 0 is first written into all of the transistors, i.e. the entire memory is erased. For this purpose, the gate lines 555 are connected to 0 Volts and the source lines 222 and the drain lines 333 are connected to −40 Volts. Subsequently, the writing into the matrix is carried out row-by-row, the 0 prevailing in specific transistors of a row being changed into a 1. If, for example, a 1 is to be recorded in the transistor 15, the potential of −40 volts is applied to its gate line 555 and likewise to the gate of the transistor 14 connected to that gate line. The supply voltage $V_D$ which preferably amounts to approximately −20 Volts is connected to the drain line 333. The source lines 222 are connected to ground by way of the switches 12 and 13. In order to prevent writing of a 1 into the transistor 14, the corresponding switch 12 in the source line is left open. Therefore, the inversion layer of the transistor 14 carries the potential of the supply voltage $V_D$. The gate voltage on the insulator 4 and 5 of the transistor 14 is not sufficient to switch the transistor 14 into the 1 state; it remains in the 0 state. The switch 13 in the source line 222 of the transistor 15 is closed; the full gate voltage is applied between the gate and the substrate. The transistor 15 is switched into the 1 state. Therefore, a 1 is selectively written into the transistor 15, while all of the other transistors remain in the 0 state.

For a read-out of the data, the read-out voltage, preferably the voltage −10 Volts, is connected to the relevant gate line. During the read-out process, the source line is connected to 0 Volts and the drain line preferably carries −70 Volts. The transistors which are in the 0 state then become conductive and the transistors which are in the 1 state do not conduct.

For high capacity storages it is necessary to connect a decoder prior to the individual gate lines connecting the gate electrodes of one row of the storage matrix, in order to enable the number of connection lines to be kept low. In a matrix containing decoders, the gate lines connect to the diffused-in zones and form a pn junction with the substrate. In single-channel technique with bulk silicon, i.e. when only p-or n-channel transistors are arranged on one chip, in relation to the substrate, voltages of only one polarity may be applied, as otherwise the pn junction would be poled in the forward direction.

In a storage arrangement having MNOS transistors of short channel length in accordance with the present invention, data is recorded into the memory with a voltage of a given potential and of only one given polarity across the gate, whereas for the erasure of data, the gate is maintained at 0 Volts ground potential and the source and the drain carry an appropriately high potential of the same polarity.

Figure 4:
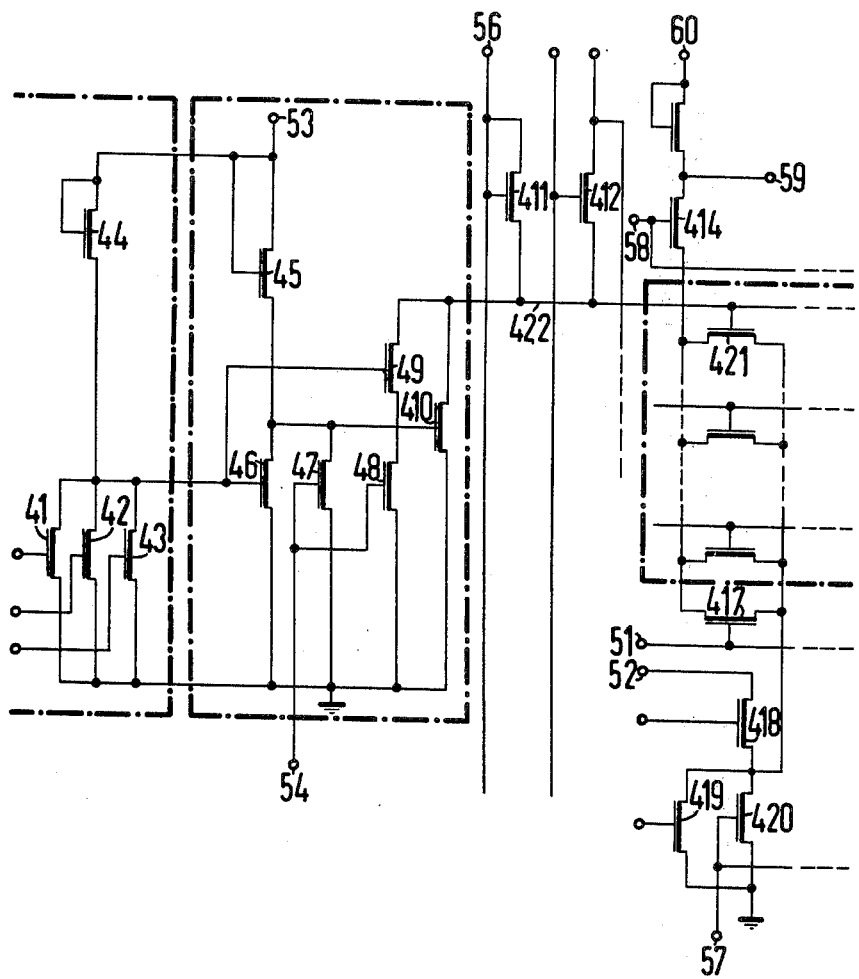
FIG. 4 is a schematic circuit diagram of a storage arrangement constructed with MNOS transistors in accordance with the present invention.

FIG. 4 illustrates a storage arrangement constructed from MNOS transistors in accordance with the invention, the transistors having short channel length. The storage arrangement comprises a storage matrix, decoder gates and an EXCLUSIVE OR gate. The function of the EXCLUSIVE OR gate is to invert the logic state at the output of the decoder gate selectively with the aid of a pulse. The decoder comprises the transistors 41, 42, 43, 44 which form the decoder gate. The gate is "selected" when the address connected to the transistors 41, 42, 43, as represented in the figure, selects the gate line 422 connected to the gate of the transistor 421. The output of the gate is connected to an EXCLUSIVE OR gate which is formed by the transistors 45, 46, 47, 48 and 49.

If the selected gate is considered, and if 0 Volts are applied at the input 54 of the EXCLUSIVE OR gate, then, since the transistor 46 is conductive, the transistors 48 and 410 are blocked, i.e. by way of the input 56 and the transistor 411 the recording voltage is connected to the selected gate line 422 which is connected to the gate of the transistor 421. No recording voltage is connected to any of the non-selected gate lines, since the latter are then short circuited by the conductive transistor 410.

The transistor 419 serves for the recording of data. If a 1 is to be recorded, the source line of the relevant storage column is connected to ground. If a 0 is to be retained, the source line of the corresponding storage column is opened. This transistor 419 corresponds to the switches 12 and 13 in FIG. 2.

The read-out process corresponds to the recording process. In this case, however, the read-out voltage, which preferably amount to approximately −10 Volts, is applied by way of the transistor 412 to the selected gate line. During the read-out process, the transistor 420 is rendered conductive by way of the input 57. Then all of the source lines of the individual transistors of one storage column are connected to ground. The transistor 414 is also in the conductive state, by way of the input 58, during the read-out process, so that in dependence upon whether the storage transistor 421 is in the 0 state or the 1 state, at the output 59 there appears either the output voltage of 0 Volts or the voltage of point 60, preferably approximately −10 Volts.

During the erasure process, as a result of the pulse at the input 51, the transistor 417 is driven conductive, i.e. the source and drain lines of the transistors of one matrix column are short circuited. The erasing voltage is applied by way of the transistor 418 which is controlled by way of the input 52 to the source and drain lines. The transistor 414 remains blocked in order that the high erasing voltage does not appear at the output 59. The transistors 419 and 420 remain blocked in order that the erasing voltage is not short circuited to ground. At the same time, the address line is selected. A voltage is applied to the input 54, and by way of the transistor 411 a recording voltage is applied to all of the gate lines. In the EXCLUSIVE OR gate which belongs to the selected gate, the transistors 48 and 49 become conductive, the recording voltage is short circuited and the gate line is, in practice, connected to 0 Volts. In the non-selected gate lines, on the other hand, the transistors 49 and the high recording voltage acts on all of the gate lines. Consequently, in the storage transistors of these rows, the source, the drain and the gate carry the same potential. The state of these elements is therefore not changed.

Although we have described our invention by reference to specific illustrative embodiments, many changes and modifications may become apparent to those skilled in the art without departing from the spirit and scope of the invention. We therefore intend to include within the patent warranted hereon all such changes and modifications as may reasonably and properly be included within the scope of our contribution to the art.

We claim:

1. An electric circuit having MNOS transistors, said electric circuit comprising a storage matrix and decoders, each of said MNOS transistors comprising a gate electrode, a source electrode, and a drain electrode, a plurality of common gate lines each connected to the gate electrodes of a respective row of said matrix, a plurality of common source lines connected to the source electrodes of a respective column of said matrix, a plurality of common drain lines connected to the drain electrodes of a respective column of said matrix, each decoder connected to a respective one of said gate lines, and each of said MNOS transistors comprising a single channel and a layered gate insulator, the MNOS transistor arranged on a substrate, and having a voltage which is variably dependent upon the electric charge stored in the gate insulator, said transistor comprising a channel length that is shorter than twice the depletion layer thickness during the recording and erasure of data, and adapted to receive, during the recording, readout and erasure of data only voltages of the same polarity at the gate, source and drain electrodes on the one hand and the common substrate on the other hand.

2. A process for the operation of an MNOS transistor in an electric circuit of the type which comrises a storage matrix and decoders, each of said MNOS transistors comprising a gate electrode, a source electrode, and a drain electrode, a plurality of common gate lines each connected to the gate electrodes of a respective row of said matrix, a plurality of common source lines connected to the source electrodes of a respective column of said matrix, a plurality of common drain lines connected to the drain electrodes of a respective column of said matrix, each decoder connected to a respective one of said gate lines, and each of said MNOS transistors comprising a single channel and a layered gate insulator, the MNOS transistor arranged on a substrate, and having a threshold voltage which is variably dependent upon the electric charge stored in the gate insulator, said transistor comprising a channel length that is shorter than twice the depletion layer thickness during the recording and erasure of data, and adapted to receive, during the recording, read-out and erasure of data only voltages of the same polarity at the gate, source and drain electrodes on the one hand and the common substrate on the other hand, comprising the steps of: storing a 1 by connecting the source electrode and the substrate to approximately the same potential, the drain electrode to an arbitrary potential and the gate electrode to a potential which is relatively high in comparison to the substrate potential, all of the potentials having the same polarity.

3. A process for the operation of the MNOS transistor as claimed in claim 2, wherein for an n-conducting substrate, storage is effected by applying 0 volts to the substrate electrode and the source electrode and by applying a potential of $\leq -30$ Volts to the gate electrode.

4. A process for the operation of an MNOS transistor in an electric circuit of the type which comprises a storage matrix and decoders, each of said MNOS transistors comprising a gate electrode, a source electrode, and a drain electrode, a plurality of common gate lines each connected to the gate electrodes of a respective row of said matrix, a plurality of common source lines connected to the source electrodes of a respective column of said matrix, a plurality of common drain lines connected to the drain electrodes of a respective column of said matrix, each decoder connected to a respective one of said gate lines, and each of said MNOS transistors comprising a single channel and a layered gate insulator, the MNOS transistor arranged on a substrate, and having a threshold voltage which is variably dependent upon the electric charge stored in the gate insulator, said transistor comprising a channel length that is shorter than twice the depletion layer thickness during the recording and erasure of data, and adapted to receive, during the recoring, read-out and erasure of data only voltages of the same polarity at the gate, source and drain electrodes on the one hand and the common substrate on the other hand, comprising the steps of: for recording a 0 in an MOS transistor and for erasing a 1 of an MOS transistor of the storage matrix, applying approximately the same potential to the gate electrode and the substrate, and applying a relatively high potential in comparison to the substrate potential to the source and drain electrodes.

5. A process for the operation of an MNOS transistor as claimed in claim 4, further defined by applying 0 Volts to the substrate and gate electrode and applying a potential of $\leq -30$ Volts to the source electrode and drain electrode.

6. A process for the operation of an MNOS transistor as claimed in claim 5 and further defined by applying a potential of $\leq -30$ Volts to the source electrode and the drain electrode when the substrate is an n-conducting substrate.

* * * * *